(12) United States Patent
Koo et al.

(10) Patent No.: US 7,615,869 B2
(45) Date of Patent: Nov. 10, 2009

(54) MEMORY MODULE WITH STACKED SEMICONDUCTOR DEVICES

(75) Inventors: Chang-Woo Koo, Seoul (KR); Byung-Se So, Gyeonggi-do (KR); Young-Jun Park, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 594 days.

(21) Appl. No.: 11/266,428

(22) Filed: Nov. 4, 2005

(65) Prior Publication Data

US 2007/0018299 A1      Jan. 25, 2007

(30) Foreign Application Priority Data

Jul. 25, 2005    (KR) .................... 10-2005-0067371

(51) Int. Cl.
*H01L 23/48* (2006.01)
*B21F 41/00* (2006.01)
*H01G 4/06* (2006.01)

(52) U.S. Cl. ............... 257/777; 29/25; 29/41; 29/42; 361/311; 361/312; 361/313

(58) Field of Classification Search .......... 257/777; 29/25.41, 25.42; 361/311–313
See application file for complete search history.

(56) References Cited

U.S. PATENT DOCUMENTS

| | | | |
|---|---|---|---|
| 5,656,856 A | 8/1997 | Kweon | |
| 5,744,827 A | 4/1998 | Jeong et al. | |
| 6,480,409 B2 | 11/2002 | Park et al. | |
| 6,642,614 B1 | 11/2003 | Chen | |
| 6,791,192 B2 | 9/2004 | Lin et al. | |
| 6,809,421 B1 | 10/2004 | Hayaska et al. | |
| 6,873,031 B2 | 3/2005 | McFadden et al. | |

FOREIGN PATENT DOCUMENTS

| | | |
|---|---|---|
| EP | 0336359 B1 | 10/1989 |
| EP | 0340527 A2 | 11/1989 |
| EP | 0582315 B1 | 2/1994 |
| JP | 61006846 A | 1/1986 |
| JP | 11168157 | 6/1999 |
| JP | 2003142624 | 5/2003 |
| JP | 2003197809 A | 7/2003 |
| JP | 2004214509 A | 7/2004 |
| KR | 101995028068 | 5/1997 |
| WO | 9724740 A1 | 7/1997 |

OTHER PUBLICATIONS

Peter, R., Ultra-low profile chip scale package challenges for 300mm die bonder, Business Briefing: Global Semiconductor Manufacturing, 2003, 1-5, www.touchbriefing.com.

*Primary Examiner*—Long Pham
*Assistant Examiner*—Steven H Rao
(74) *Attorney, Agent, or Firm*—Volentine & Whitt, PLLC

(57) ABSTRACT

Embodiments are described in which a stacked arrangement of integrated circuit packages comprises a dummy substrate comprising an embedded discrete or distributed capacitor connected to first and/or second power voltages, or an embedded termination register connected to one or more clock, control, address, and/or data signals(s).

20 Claims, 14 Drawing Sheets

MEMORY MODULE WITH STACKED SEMICONDUCTOR DEVICES

BACKGROUND OF THE INVENTION

1. Field of the Invention

Embodiments of the present invention relate generally to memory systems and memory modules. More particularly, embodiments of the invention relate to semiconductor devices comprising a stacked arrangement of integrated circuits (ICs), memory modules incorporating such semiconductor devices, and memory systems incorporating such memory modules.

2. Description of the Related Art

Memory modules have long been used to physically and operationally group semiconductor devices for efficient use within memory systems. Conventional host systems such as servers and personal computers (PCs) routinely incorporate memory systems including memory modules of various configurations. Individual memory modules are typically implemented on a small printed circuit board (PCB) (e.g., a daughterboard) adapted for mechanical and electrical connection with a larger PCB (e.g., a motherboard) via a corresponding slot connector.

FIG. 1 illustrates a conventional memory system comprising an arrangement of memory modules (MM0 through MMn) connected on a motherboard 10 with a corresponding chipset 12. The term "chipset" is used to denote a collection of conventionally understood circuitry adapted to provide power, clock, control, address, and/or data signals to the associated memory modules. This circuitry may be implemented in a single semiconductor package (i.e., a "chip") or in a family of related chips. As is conventionally understood, the various circuitry in a chipset may take many different forms. A chipset may include, for example, power signal generating circuit(s), a memory controller, a bus re-drive circuit, a phase-lock or delay-lock loop circuit, and/or a clock circuit or clock buffer. At a minimum, however, the term chipset as used throughout this description subsumes circuitry adapted to provide at least one clock signal (CLK) and at least first and second power signals (e.g., Vcc and Vss) to the memory modules.

In the illustrated example of FIG. 1, each memory module is populated with a plurality of semiconductor devices. Semiconductor memory devices, such as DRAMs, are most typically mounted on conventional memory modules, but any synchronous or non-synchronous memory device, and/or non-memory semiconductor device(s) may be mounted on a memory module.

An exemplary and conventional memory module is further illustrated in FIG. 2. The memory module generally comprises a PCB 20 mounting a plurality of semiconductor devices 22 using conventional techniques. As noted above, the semiconductor devices 22 may take one or more conventional forms, but generally include at least one memory device, such as a DRAM, SRAM, and/or SDRAM. A plurality of conductive tabs 24 are typically formed on at least one edge of PCB 20. Tabs 24 are adapted to mechanically connect PCB 20 with a slot connector provided on a motherboard. Tabs 24 are also adapted to provide a connection path by which electrical signals are communicated to/from motherboard components (e.g., the chipset) and components on memory module PCB 20.

Various electrical signals (e.g., data, control/address, power, and/or clock) are communicated from tabs 24 to the plurality of semiconductor devices 22 via numerous signal lines formed on PCB 20. The numerous, very thin, and often geometrically complex signal lines are not shown in FIG. 2 for the sake of clarity. Suffice it to say that these signal lines generally fill much, if not all, of the space (i.e., surface area) practically available on PCB 20 outside of the space allocated to semiconductor devices 22, tabs 24, and certain conventionally understood "peripheral circuits" 23 and 26. There are many different kinds of peripheral circuits, including (e.g.,) Serial Presence Detection (SPD) registers, clock circuits—including PLL and DLL circuits, power capacitors, signal line termination circuits, control/address signal registers, etc.

The past and future expected evolution of semiconductor memory devices may be summarized in one aspect by a statement that semiconductor memory devices have and will continue to store/communicate more data at higher speeds with each succeeding generation. As a result of this truism, an increasing number of signal lines, most carrying signals at faster and faster data rates, are generally required to connect with semiconductor devices mounted on a memory module. Common sense dictates that as the number and layout complexity of signal lines connecting tabs 24 with semiconductor devices 22 increase, the relatively fixed surface area provided by PCB 20 will become increasingly scarce.

The use semiconductor devices comprising an arrangement of stacked integrated circuits (ICs) (hereafter generically referred to as "stacked semiconductor devices") is one conventional response to the increasing scarcity of available surface area on memory module PCBs. Stated in other terms, the use of stacked semiconductor devices is one approach to greatly increase the number of available semiconductor devices on a memory module without requiring a material expansion in the size of the PCB mounting the semiconductor devices. This advantage is particularly critical in applications where the size of the PCB implementing the memory module is fixed by an applicable design standard or a legacy compatibility requirement, but the performance expectations (e.g., data bandwidth) for the memory module must nonetheless increase.

FIG. 3 generally illustrates a conventional stacked semiconductor device. A board on chip (BOC) packaging technique is shown in the illustrated example of FIG. 3. However, the discussion that follows might readily be applicable to other chip scale packaging (CSP) techniques including as examples, Ball Grid Array (BGA), Lead on Chip (LOC), through-hole stacked packages, etc.

The stacked semiconductor device of FIG. 3 comprises a first semiconductor package 31 mounted on PCB 20 and a second semiconductor package 32 mounted on first semiconductor package 31. (Additional semiconductor packages may of course be stacked on the illustrated example, but the considerations discussed hereafter are not materially altered by a designer's choice of stacking height).

First semiconductor package 31 comprises a semiconductor chip 31a mounted on a substrate 31b. Bonding pads 31c on semiconductor chip 31a are connected to bonding pads 31d on substrate 31b by metal wires which are encapsulated in a protective encapsulation material 31e. One or both primary surfaces of substrate 31b may comprise electrical signal lines (not shown) implemented by conductive patterns formed using conventional techniques. These signal lines rout the various electrical signals described above to/from semiconductor chip 31a. Accordingly, the conductive patterns variously connect ball lands (e.g., 31f and 31g) formed on substrate 31b. Solder balls 33 connect, for example, ball lands 31f on substrate 31b with corresponding ball lands formed on PCB 20. One or more conductive via(s) 34 formed through substrate 31b may be used to connect respective ball lands (such as e.g., 31f and 31g) and/or conductive patterns formed on opposite sides of substrate 31b.

First and second power signals are provided to semiconductor chip 31a from PCB 20 through power capacitors type peripheral circuits 35 mounted on PCB 20. For example, a first power signal (e.g., Vss) may be provided to semiconductor chip 31a from a signal line or circuit component on PCB 20 through power capacitor 35 and a designated ball land formed on PCB 20. A corresponding solder ball 33 then conducts the first power signal upwards (in the context of the illustrated example) to a corresponding ball land 31f formed on substrate 31b. From this point, the first power signal may be transmitted via a conductive pattern formed on substrate 31b to a designated contact pad 31d through a connecting metal wire to a corresponding bonding pad 31c associated with the semiconductor chip 31a.

The first power signal may also be conducted from ball land 31f through conductive via 34 to a corresponding ball land 31g. From ball land 31g, the first power signal may be conducted upwards to the second semiconductor package 32 mounted on first semiconductor package 31 through an analogous ball land and solder ball structure. In this manner or an analogous manner, as dictated by the specific stacking technology used to implement the stacked semiconductor device, the first and second power signals, as well as various clock signals and/or control/address/data signals, may be connected from PCB 20 to each semiconductor package in the stacked semiconductor device.

Power capacitors 35 mounted on PCB 20 are conventionally required in order to reduce or remove noise on the respective power signals. Power signal noise tends to increase with the use of higher frequency data signals carried on densely proximate integrated signal lines. Yet, as previously noted these two conditions necessarily arise from the increasing data bandwidth requirements placed on contemporary memory modules.

At some point in nearly all memory module designs, the noise effect of high frequency data signals on numerous, narrow, closely spaced signal lines becomes overwhelming. This is particularly true of DC power signal lines which are notorious for "picking up" high frequency noise from nearby signal lines. Noisy power signals have a well documented history of corrupting data circuit operations within semiconductor memory devices. Accordingly, nearly all power signals applied to semiconductor memory devices mounted on a memory module are provided through a power capacitor.

Power capacitors are a well known, inexpensive and effective mechanism adapted to remove AC noise from DC power signals. Thus, power capacitors are routinely provided as one type of peripheral circuit 23 on conventional memory modules. (See, FIG. 2)

High frequency signal coupling into power signals is not the only type of noise problem that must be addressed in contemporary memory module designs. As the transmission frequency of control/address/data signals communicated to/from semiconductor devices on memory modules increases, the hazard of signal reflections (i.e., another type of noise) on the signals lines also increases. Signal reflections may occur, for example, when signal line impedance(s) are different from the impedance of the signal transmission source. This well understood problem may be addressed by the use of impedance matching termination resistors on the signal lines. Here again, signal line termination resistors are often provided as another type of peripheral circuit 23 on conventional memory modules. (See, FIG. 2).

FIG. 4 further illustrates the conventional reality that many signal lines communicating high frequency data signals connected to/from semiconductor memory devices on a memory module require impedance matched termination in order to reduce or eliminate noisy signal reflections. In FIG. 4, one or more signal lines, generically indicated as I/O bus 40, are respectively connected to the semiconductor memory devices and then terminate at a termination register comprising a termination resistor (Rterm) connected to a termination voltage (Vterm). Conventionally, a termination register, comprising one or more well understood resistive circuits, is typically formed on memory module PCB 20, like the power capacitors 35 shown in FIG. 3.

Unfortunately, the size of power capacitors and the size of termination registers conventionally formed on memory module PCBs are increasing with demands for greater signal line counts and higher operating frequencies. At the same time, signal line routing on the primary surface(s) of the memory module PCB is becoming increasingly restricted. Additionally, the risk of damage to power capacitors and termination registers mounted on the memory module PCB by external mechanical impact is unacceptable high, because, by their very nature, memory modules are intended to be handled by manufacturing personnel during a host device assembly or retrofit.

In sum, despite their effective use within memory module designs, power capacitors and terminations registers have an unfortunate tendency to occupy a disproportionate share of the scarce surface area available on a PCB implementing a memory module. Yet, the recognition of an increasing requirement to condition (e.g., reduce noise) signals applied to semiconductor devices in a stacked semiconductor is not a new one. Despite the apparent drawbacks, the use of PCB mounted power capacitors remains almost universal.

Some previous attempts have been made to provide power capacitors within the structure of a stacked semiconductor device, rather than placing them on the memory module PCB. Consider, for example, U.S. Pat. No. 6,809,421 in which an intermediate substrate is provided between stacked semiconductor packages. The intermediate substrate comprises internally formed, extended signal leads. The extended signal leads are implemented to provide a distributed capacitive effect on power signals connected to the leads. Unfortunately, this approach requires a specially constructed intermediate substrate, and provides only general remedial conditioning of the power signals through the use of a distributed capacitive effect.

SUMMARY OF THE INVENTION

Embodiments of the invention recognize that conventional approaches to the provision of conditioned signals (e.g., power, clock, and/or control/address/data) to stacked semiconductor devices mounted on a memory module are inadequate. Embodiments of the invention further recognize that the number and layout complexity signal lines on memory module printed circuit boards (PCBs) has reached a state where the continued provision of power capacitors and/or termination registers on a memory module PCB is simply too expensive from a design standpoint.

Thus, in one embodiment, the invention provides a semiconductor device comprising a stacked arrangement of integrated circuit packages having a memory device package configured to receive first and second power signals, and a dummy substrate formed on the memory device package and comprising an embedded discrete capacitor connected between the first and second power signals.

In another embodiment, the invention provides a semiconductor device, comprising a stacked arrangement of integrated circuit (IC) packages having a memory device package configured to receive first and second power signals and a dummy substrate formed on the memory device package at a top position within the stacked arrangement of IC packages. The dummy substrate comprises an insulating layer having a first principal surface facing the memory device package and a second principal surface opposite the first principal surface, a first conductive electrode sheet formed on the first principal surface and electrically connected to a first one of the first power signal or the second power signal, a second conductive electrode sheet formed on the second principal surface, and a via electrically connecting the second conductive electrode sheet through the insulating layer to a second one of the first power signal or the second power signal.

In yet another embodiment, the invention provides a semiconductor device comprising a stacked arrangement of integrated circuit packages having a memory device package configured to receive at least one signal via at least one signal line, and a dummy substrate formed on the memory device package and comprising an embedded termination register electrically connected to the at least one signal line.

In still another embodiment, the invention provides a memory module comprising a plurality of memory devices formed on at least one side of a printed circuit board, wherein at least one of the plurality of memory devices comprises a stacked arrangement of IC packages. The stacked arrangement of IC packages comprises a semiconductor memory device package configured to receive first and second power signals, and a dummy substrate formed on the memory device package and having an embedded discrete capacitor connected between the first and second power signals.

In still another embodiment, the invention provides a memory module printed circuit board (PCB) comprising; a plurality of tabs adapted to electrically connect the printed circuit board to a motherboard, a plurality of memory device areas, each populated by a stacked arrangement of IC packages, and an electrical pattern area substantially populated in the absence of any power capacitors or termination registers by electrical patterns connecting the at least one of the plurality of tabs to at least one of the plurality of memory devices. Each stacked arrangement of IC packages comprises a semiconductor memory device package configured to receive first and second power signals, and a dummy substrate formed on the memory device package and comprising an embedded discrete capacitor connected between the first and second power signals.

In still another embodiment, the invention provides a memory system comprising a chipset configured on a motherboard to provide an external differential signal and control/address/data signals to a plurality of memory modules connected to the motherboard via respective slots. Each memory module comprises a printed circuit board, comprising a plurality of tabs adapted to electrically connect the printed circuit board to a respective slot, a plurality of stacked arrangements of IC packages, each comprising a memory device package configured to receive first and second power signals, and a dummy substrate formed on the memory device package and comprising an embedded discrete capacitor connected between the first and second power signals.

In still another embodiment, the invention provides a memory system comprising a chipset configured on a motherboard to generate an external differential signal and provide a plurality of control/address/data signals via a signal bus to a plurality of memory modules. Each memory modules comprises a plurality of stacked integrated circuit (IC) packages formed on a printed circuit board, wherein each stacked arrangement of IC packages comprising a memory device package configured to receive, first and second power signals via respective first and second power signal lines and an internal differential signal derived from the external differential signal via a differential signal line, and a dummy substrate formed on the memory device package and comprising an embedded discrete capacitor connected between the first and second power signal lines, and a first embedded termination register electrically terminating the differential signal line.

BRIEF DESCRIPTION OF THE DRAWINGS

The invention is described in relation to several embodiments illustrated in the accompanying drawings. Throughout the drawings, like reference numbers indicate like exemplary elements, components, or steps. In the drawings.

DESCRIPTION OF THE EXEMPLARY EMBODIMENTS

Exemplary embodiments of the invention are described below with reference to the corresponding drawings. These embodiments are presented as teaching examples. The actual scope of the invention is defined by the claims that follow.

Figure 1:
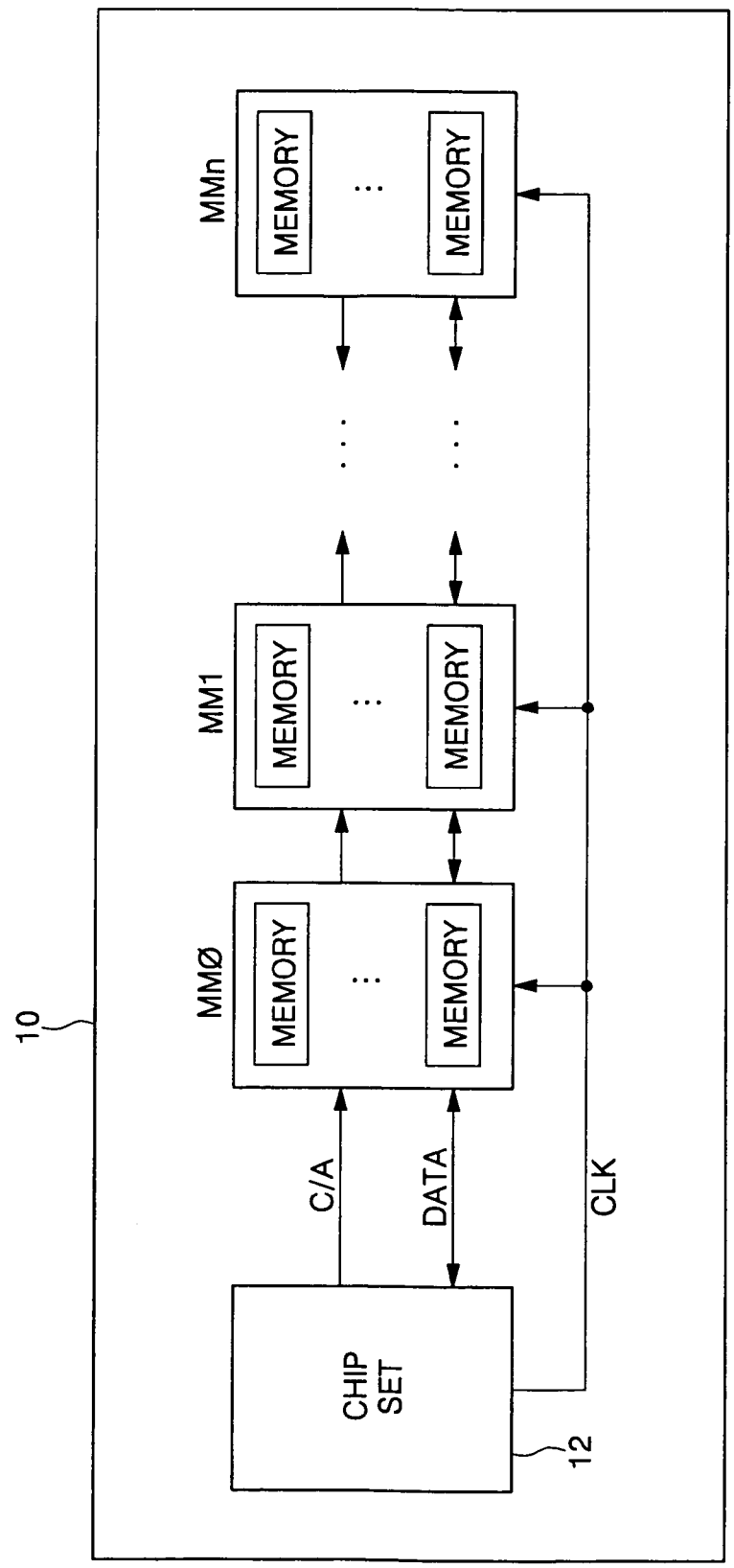
FIG. 1 is a diagram of an exemplary, conventional arrangement of memory modules on a motherboard with a corresponding chipset.
Figure 2:
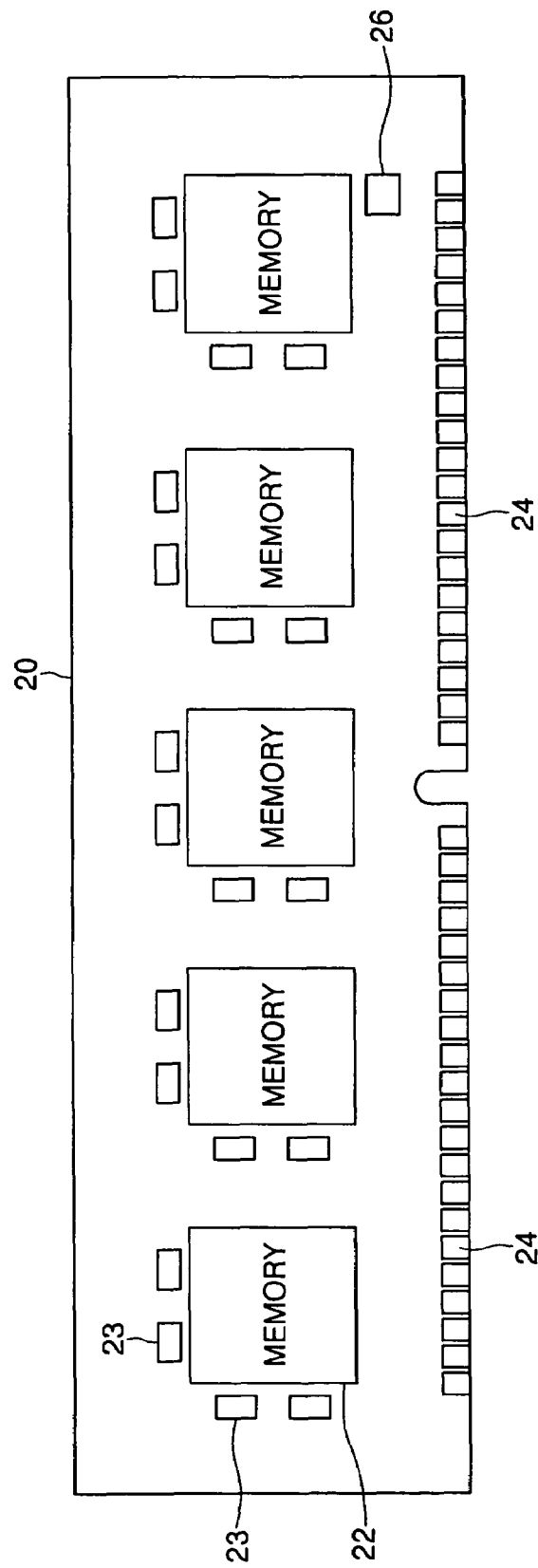
FIG. 2 is a diagram of one exemplary, conventional memory module.
Figure 3:
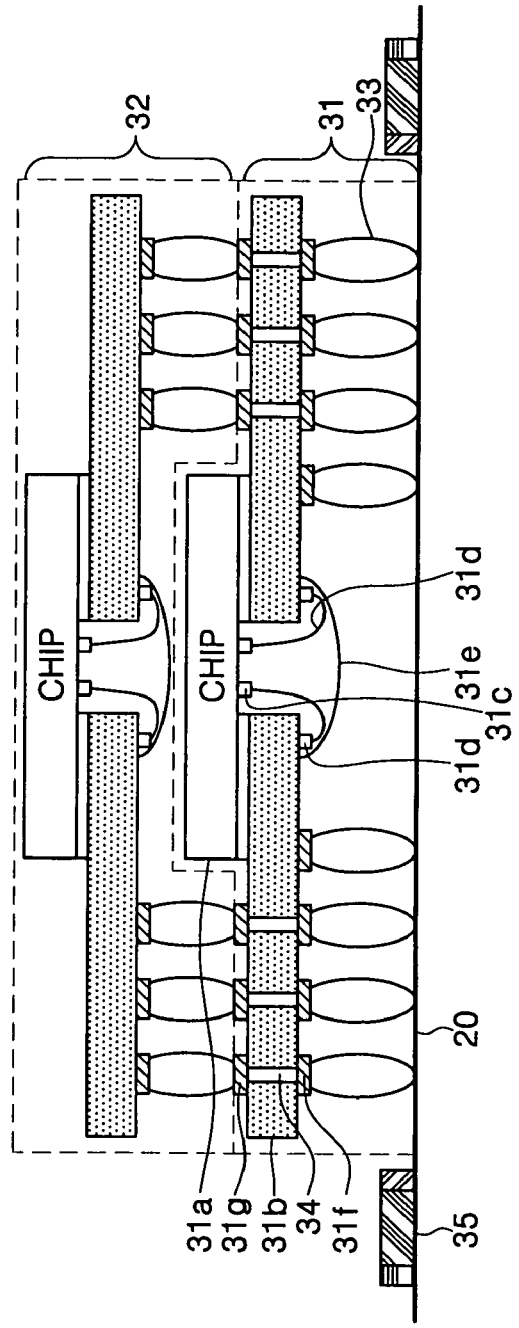
FIG. 3 is a diagram of an exemplary, conventional stacked semiconductor device.

Embodiments of the invention relate to stacked semiconductor devices, memory modules incorporating stacked semiconductor devices, and memory systems incorporating such memory modules. For example, memory modules comprising stacked semiconductor devices implemented in accordance with one or more of the following embodiments, or their equivalents, may be readily incorporated within conventional memory system architectures such as the one generally illustrated in FIG. 1. Further, memory modules comprising stacked semiconductor devices implemented in accordance with one or more of the following embodiments, or their equivalents, may be implemented in largely conventional memory module form factors (e.g., PCB size and shape) like the one illustrated in FIG. 2, however, with a reduced number of peripheral circuits mounted on the PCB.

The power signals described hereafter may, for example, be provided to the memory modules by a chipset associated with the memory modules on a motherboard. First and second power signals are described in the exemplary embodiments that follow. These two exemplary power signals may correspond, for example, to the conventionally used power voltages, Vss and Vcc, but may be otherwise defined. Embodiments of the invention are not, however, limited to only two power signals, but additional (or alternative) power signals may be handled in a manner consistent with the teachings of the exemplary embodiments. Furthermore, the first and second power signals may be variously defined according to voltage level, swing, threshold, and polarity at the discretion of the memory system designer.

Similarly, one or more clock signal(s), control signal(s), address signal(s) and/or data signal(s) may be provided to the memory modules by a chipset associated with the memory modules on a motherboard. These other (non-power) signals may be fixed or selectively variable, and may be defined according to frequency, phase, voltage, etc., at the discretion of the memory system designer. Certain clock signals or control/address/data signals may be implemented using differential signaling technique(s) in which case the illustrated signal lines should be understood as comprising dual differential signal lines. The formation and use of differential signals within memory systems incorporating memory modules is conventionally understood.

In a similar vein, the generic use of control/address signals as well as data input/output (I/O) signals in conjunction with memory systems incorporating memory modules is also well understood. Those of ordinary skill in the art will understand that the designations of address signals, address signal lines, control signals, control signal lines, data signals and/or data signal lines are all matters of routine design choice. In this regard, address, control and/or data signals may be multiplexed on common signal lines and/or uniquely ascribed to one or more sets of dedicated signal lines.

Figure 5:
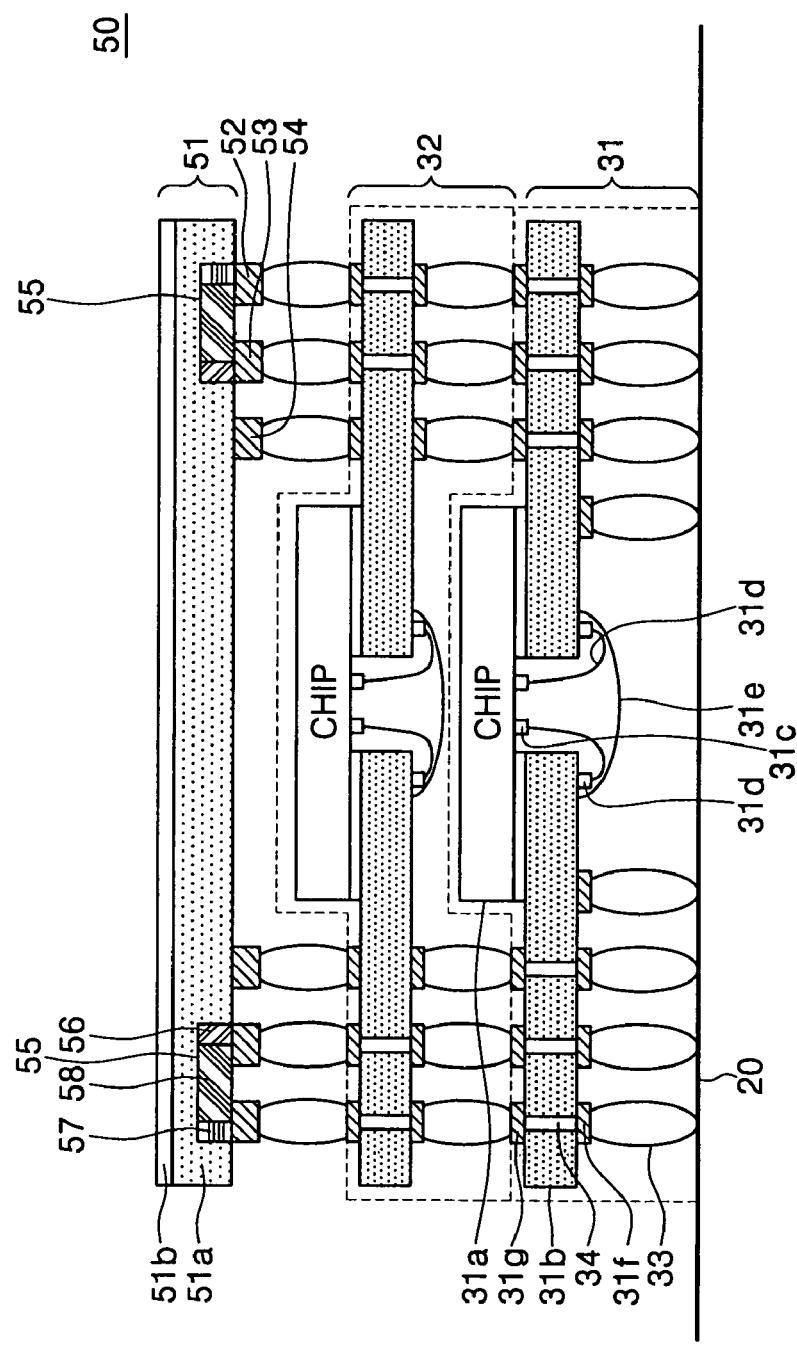
FIG. 5 is a diagram of an exemplary stacked semiconductor device and serves to illustrate, in relevant part, one embodiment of the invention.
Figure 6A:
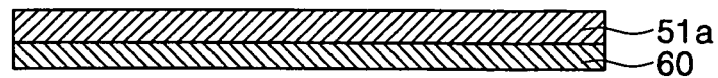
FIGS. 6A through 6D further illustrate in one related embodiment the exemplary stacked semiconductor device shown in FIG. 5.
Figure 6B:
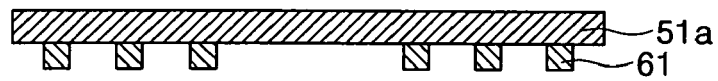
Figure 6C:
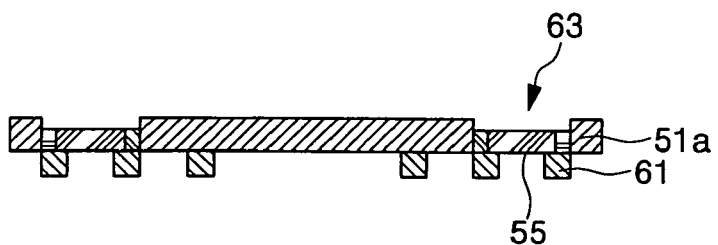
Figure 6D:
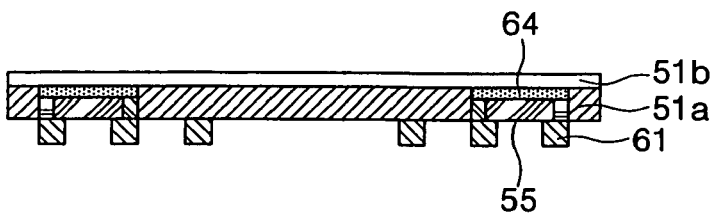

FIG. 5 illustrates a stacked semiconductor device formed in accordance with one embodiment of the invention. Stacked semiconductor device 50 is assumed for purposes of this explanation to be formed on memory module PCB 20, and to comprise a first semiconductor package 31, a second semiconductor package 32, and a dummy substrate 51. The first and second semiconductor packages may be conventional in design and fabrication, and may be formed according to conventionally available packaging techniques as CSP, BGA, FBGA, LOC, through-hole, plastic packaging, etc. However, embodiments of the invention are not limited to only existing chip scale packaging techniques, but are generally applicable to any stacked semiconductor type or corresponding fabrication technique. Further, the first and second semiconductor packages may be similar or different in nature. That is, embodiments of the invention will find application in composite stacked semiconductor devices.

Dummy substrate 51 generally comprises in the illustrated example an insulating layer 51a which may be formed using any one of a number of conventionally available techniques. A protective layer 51b may be (optionally) incorporated into dummy substrate 51 to provide protection to an upper surface of the stacked semiconductor device. (Of note, the terms "upper," "lower," "upward," and "downward," along with similarly direction-oriented terms are used to describe certain features of the exemplary embodiments that follow. These terms have obvious application to the accompanying illustrations but should not be narrowly construed as artificially mandating some vertical (up/down) or horizontal (lateral) planes of orientation, implementation, use, or manufacture for stacked semiconductor devices).

Dummy substrate 51 further comprises one or more embedded, discrete power capacitors 55. In the illustrated embodiment, two (2) discrete power capacitors 55 are used, but only one or any reasonable number of power capacitors might be used. This illustrated arrangement of power capacitors is easily accommodated by the space available within dummy substrate 51. Furthermore, discrete power capacitors, unlike distributed capacitive structures, may be easily and accurately trimmed using conventional techniques.

In the illustrated embodiment, power capacitor 55 is embedded within insulating layer 51a. The term "embedded" refers to any physical configuration in which a substantial portion, but not necessarily all, of power capacitor 55 is surrounded by an insulting material integral to or associated with insulating layer 51a. Exemplary power capacitor 55 comprises a first electrode 56 (e.g., an anode) and a second electrode 57 (e.g., a cathode) separated by a dielectric layer 58.

Dummy substrate 51 further comprises a number ball lands (e.g., 52, 53, and 54) adapted to connect dummy substrate 51 with an uppermost semiconductor package in the stacked semiconductor device (e.g., semiconductor package 32 in the illustrated example). In one embodiment, ball land 52 functions as a first power signal ball land connecting dummy substrate 51 to a corresponding ball land (or similar structure) on second semiconductor package 32 which conducts the first power signal (e.g. Vcc). Second power signal ball land 53 similarly conducts the second power signal (e.g., Vss). A number of dummy ball lands (e.g., 54) may be included within the connection scheme by which dummy substrate 51 is attached to the uppermost semiconductor package in the stacked semiconductor device. That is, in one aspect of the illustrated embodiment, dummy ball lands are used to provide mechanical strength and stability to the overall package design.

As shown in FIG. 5, power capacitor 55 may be formed across the first and second power signals using respective connections between first electrode 56 and first power signal ball land 52, and second electrode 57 and second power signal ball land 53. In this manner, a discrete capacitor may be introduced between the first and second power signals to reduce high frequency noise on the power signals, without occupying any space on the memory module PCB. Further, since discrete capacitor 55 is embedded within insulating layer 51a and protected above by protection layer 51b, the risk of mechanical damage to the discrete power capacitor is greatly reduced.

The two (2) discrete power capacitors illustrated in the exemplary stacked semiconductor device of FIG. 5 may be readily connected to the first and second power signals running up opposite sides of the stacked semiconductor device. This arrangement allows easy reach by the first and second power signals to the semiconductor chips within the respective semiconductors packages forming the stacked semiconductor device.

Aspects related to the making and use of dummy substrate 51 are further illustrated in FIGS. 6A through 6D, 7A, and 7B. FIGS. 6A through 6D are edge views of dummy substrate 51 during different phases of an exemplary fabrication process.

Dummy substrate 51 may be fabricated by forming a conductive layer 60 (e.g., a copper (Cu) layer) on a principal surface of insulating layer 51a. (See, FIG. 6A) Once formed, conductive layer 60 is patterned to form, for example, the ball lands described above and/or related conductive patterns. (See, FIG. 6B). Recesses 63 are then selectively formed through insulting layer 51a and discrete power capacitors 55 are then respectively formed in recesses 63, such that the capacitor electrodes and ball lands are electrically connected. (See, FIG. 6C). Finally, any residual portions 64 of recesses 63 are filled and protective layer 51b may thereafter be formed, if desired. (See, FIG. 6D).

Figure 7A:
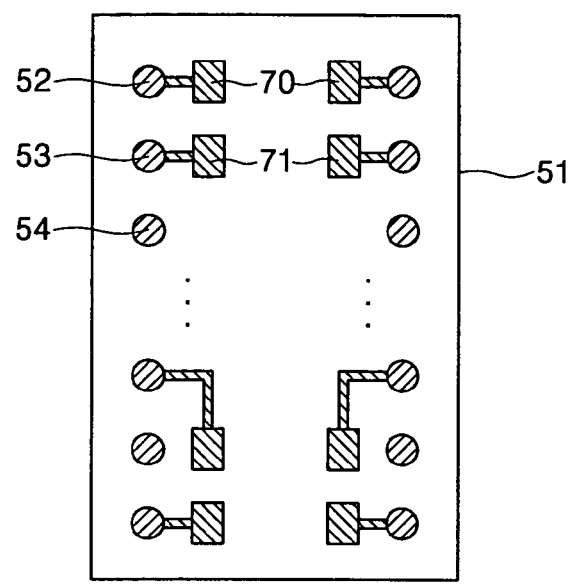
FIGS. 7A and 7B further illustrate in another related embodiment the exemplary stacked semiconductor device shown in FIG. 5.

FIG. 7A is a plan view of dummy substrate 51 following the patterning of conductive layer 60. (See, FIG. 6B). In addition to the formation of ball lands 52, 53, and 54, conductive layer 60 is patterned to form, for example, various pad structures and/or conductive patterns. As more specific examples, dummy substrate 51 shown in FIG. 7A further comprises a first power signal pad 70 and a second power signal pad 71 respectively connected to corresponding ball lands 52 and 53 via short conductive patterns formed from conductive layer 60. Conductive pads such as 70 and 71 are useful in certain embodiments where formation of a power capacitor 55 directly on the first and second power signal ball lands in not possible or not desired. Rather, the use of corresponding conductive pad structures (e.g., structures comprising a pad and/or connecting conductive patterns) allows greater ease and flexibility in the design, positioning, and formation of power capacitor 55 within dummy substrate 51. (See, e.g., FIG. 7B).

Figure 7B:
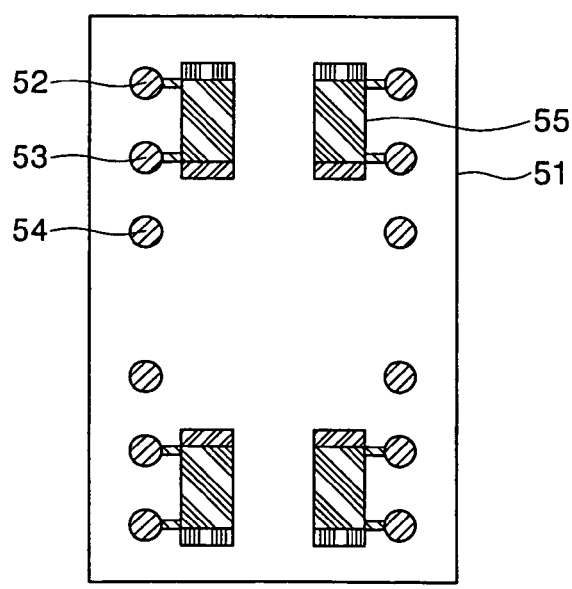
Figure 8A:
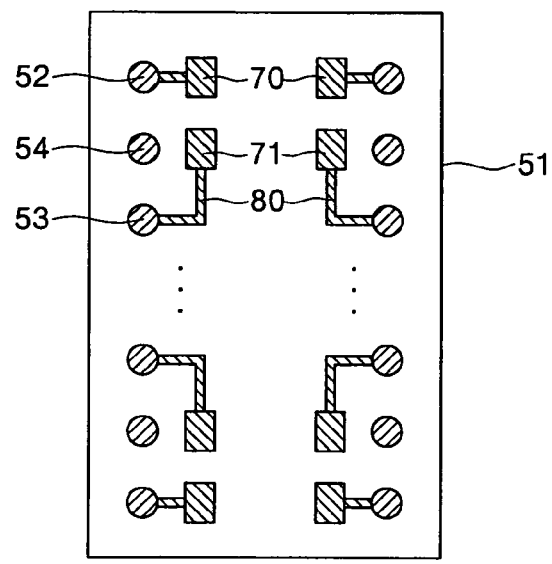
FIGS. 8A and 8B further illustrate in yet another related embodiment the exemplary stacked semiconductor device shown in FIG. 5.
Figure 8B:
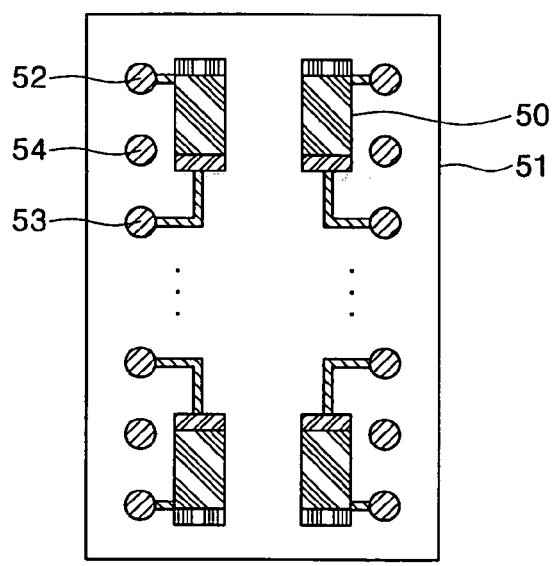

This general concept is further extrapolated in the example illustrated in FIGS. 8A and 8B. Dummy substrate 51 shown in FIG. 8A illustrates a circumstance in which the first and second power ball lands are separated by a distance greater (or potentially less) than the contemplated width of power capacitor 55. For example, a supporting dummy ball land 54 may be interposed between first and second ball lands 52, 53 in order to provide greater mechanical support. In any event, first pad structure 70 remains as shown in FIGS. 7A and 7B, but second pad structure 71 is connected to second power signal ball land 53 via a more lengthy and geometrically complex conductive pattern 80.

Thus, the design size and shape of power capacitor 55, as well as its location on dummy substrate 51 may be addressed as separate issues from the layout of ball lands on dummy substrate 51. Unlike the conventional memory module PCB formerly holding the power capacitors, dummy substrate 51 should in most circumstances provide sufficient space to readily accommodate multiple design parameters and considerations.

Figure 9:
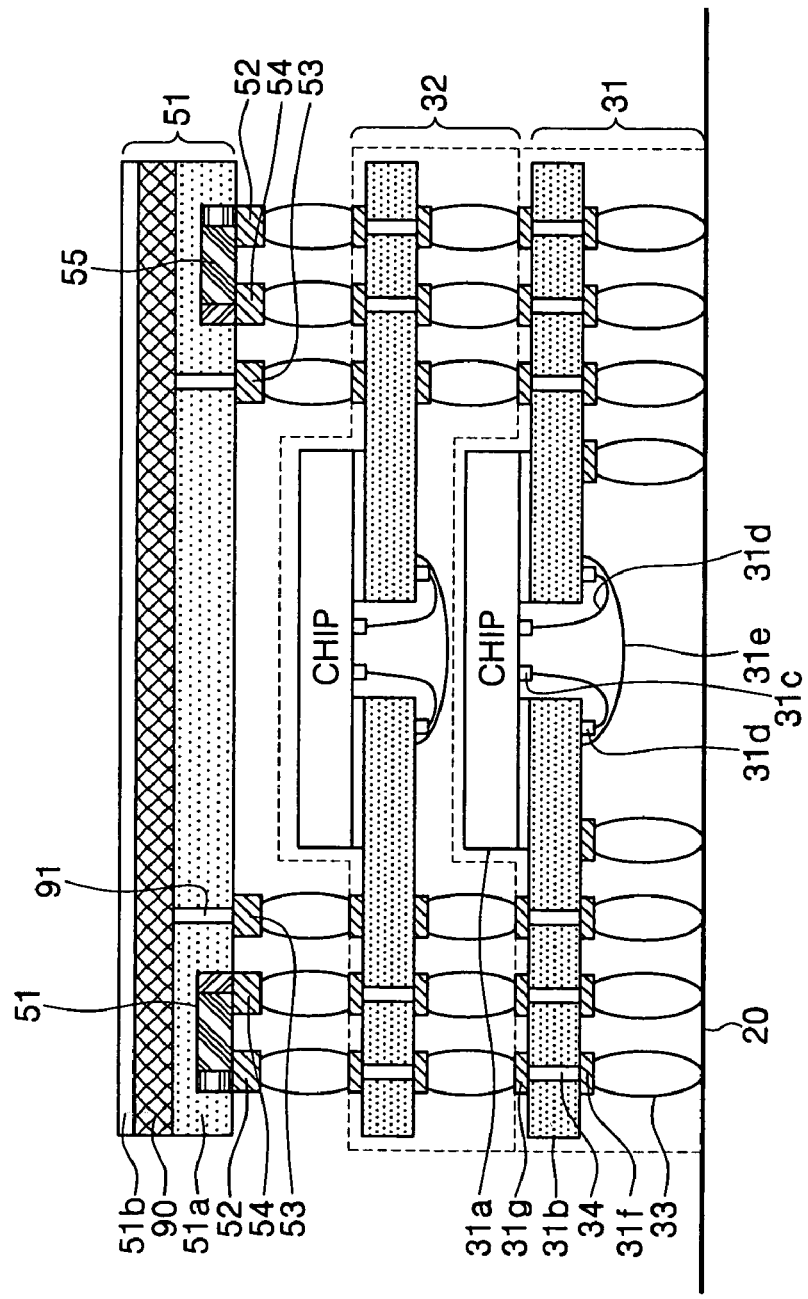
FIG. 9 is a diagram of an exemplary stacked semiconductor device and serves to illustrate, in relevant part, another embodiment of the invention.

FIG. 9 illustrates a stacked semiconductor device formed in accordance with another embodiment of the invention. In many ways, the illustrated device is similar in exemplary implementation to the device shown in FIG. 5. However, a first conductive sheet element 90 is added to dummy substrate 51 in the illustrated example between the upper surface of insulating layer 51a and protective layer 51b. First conductive sheet 90 may be formed from a metal layer such as copper (Cu). Optionally, first conductive sheet 90 may be electrically connected to a desired voltage (e.g., Vss or Vcc) through one or more conductive vias 91 formed through insulating layer 51a.

Figure 10A:
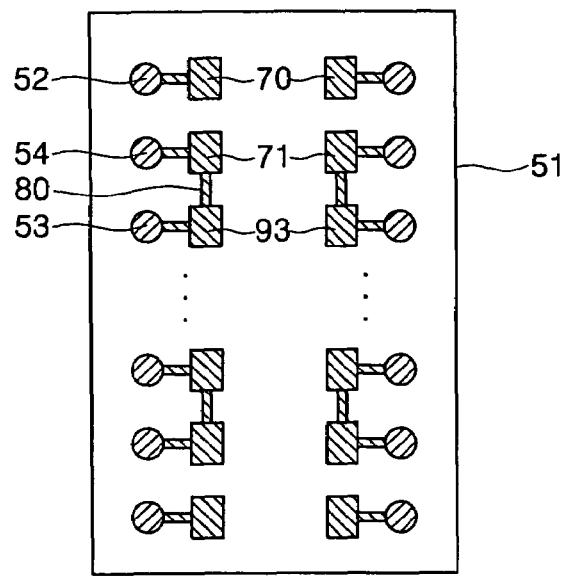
FIGS. 10A through 10C further illustrate in one related embodiment the exemplary stacked semiconductor device shown in FIG. 9.
Figure 10B:
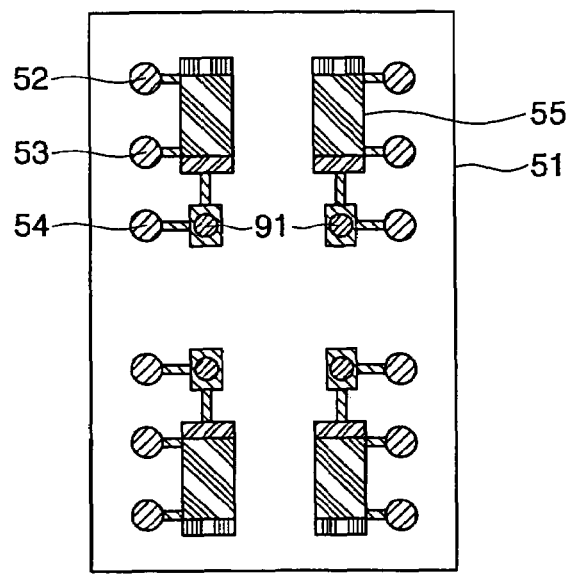
Figure 10C:
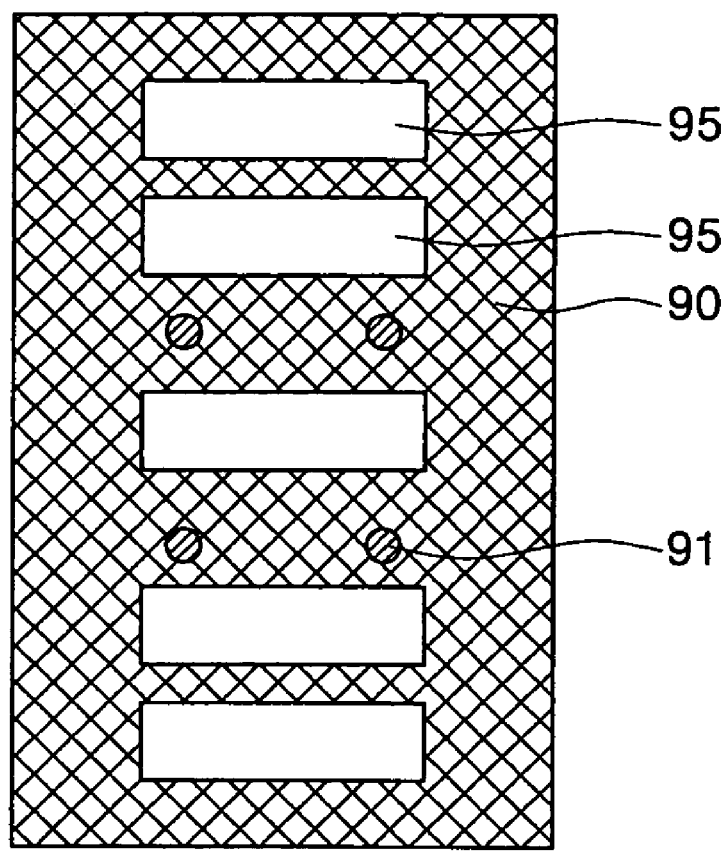

Several aspects of the dummy substrate described in relation to FIG. 9 are further illustrated in FIGS. 10A through 10C. Within this descriptive context of the exemplary embodiment(s) shown in FIG. 10A through 10C, it is assumed that first conductive sheet 90 is connected to the second power signal (e.g., Vss). Thus, second power signal ball land 53, dummy ball land 54, and second conductive pad 71, and a conductive via pad 93 are respectively connected by conductive pattern 80 on one principal surface of insulating layer 51a. (See, FIG. 10A).

One or more conductive via(s) 91 are then formed through insulating layer 51a to reach the opposite, second principal surface of insulating layer 51a. (See, FIG. 10B). First conductive sheet 90 is then formed on the opposite second principal surface of insulating layer 51a in electrical contact with conductive via 91. (See, FIG. 10C).

Of further note and as shown in FIG. 10C, first conductive sheet 90 may be formed with one or more voids 95. Voids 95 serve to dissipate mechanical stress in first conductive sheet 90 caused by thermal expansion and/or contraction. Voids 95 are shown in FIG. 10C with rectangular shapes, but any reasonable shape may be used to form one or more voids in first conductive sheet 90.

The addition of first conductive sheet 90 in the exemplary embodiment illustrated in FIGS. 9 and 10A through 10C forms a ground plane across all or most of the stacked semiconductor device. Provision of this ground plane tends to further quiet electrical noise.

Figure 11:
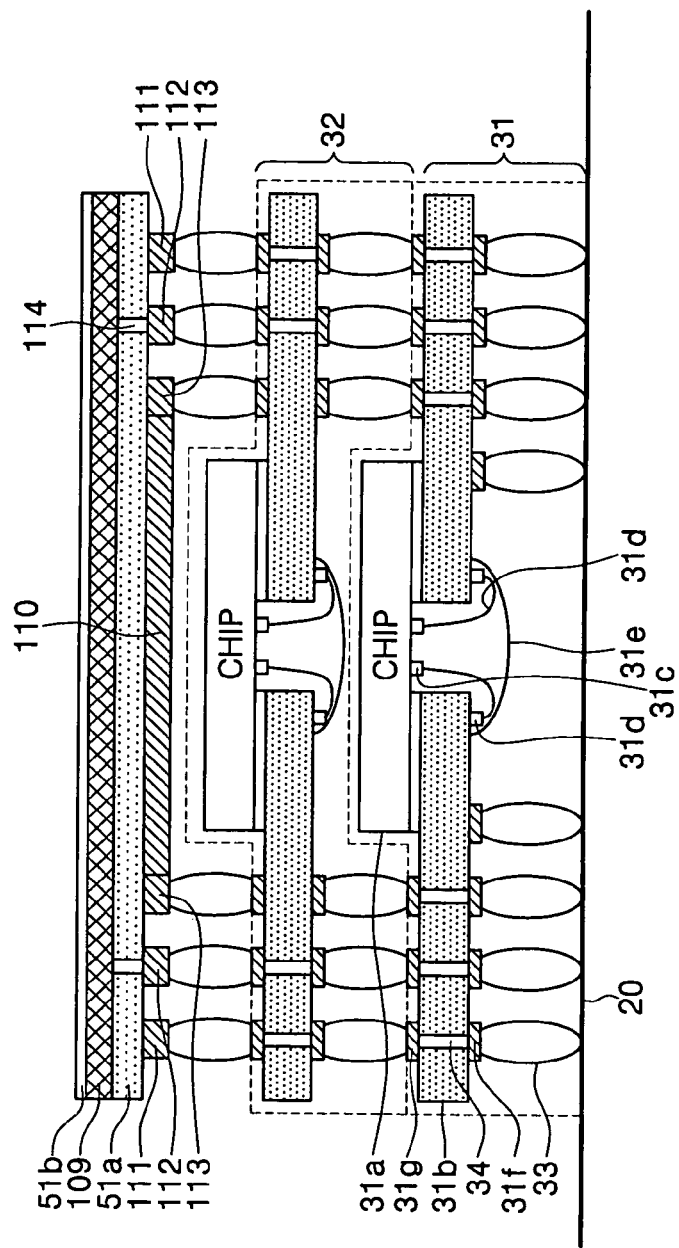
FIG. 11 is a diagram of an exemplary stacked semiconductor device and serves to illustrate, in relevant part, yet another embodiment of the invention.
Figure 12A:
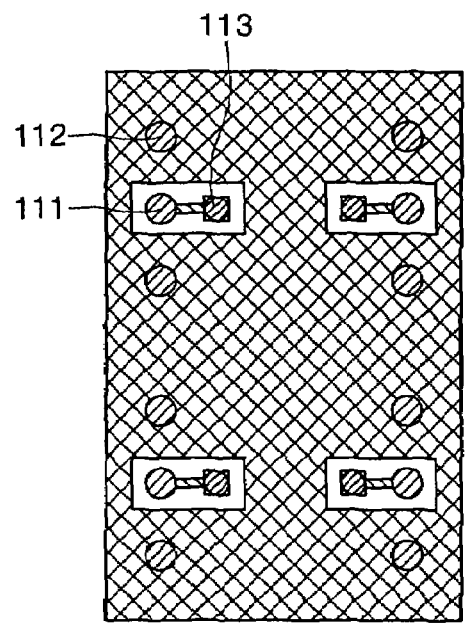
FIGS. 12A and 12B further illustrate in one related embodiment the exemplary stacked semiconductor device shown in FIG. 11; and, FIG. 13 is a diagram of an exemplary stacked semiconductor device and serves to illustrate, in relevant part, still another embodiment of the invention.
Figure 12B:
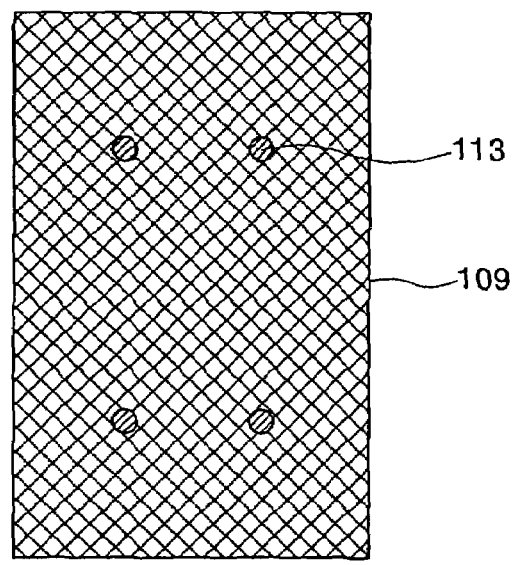

FIG. 11 illustrates a stacked semiconductor device formed in accordance with yet another embodiment of the invention. The stacked semiconductor device of FIG. 11 replaces the embedded discrete power capacitors of FIGS. 5 and 9 with a distributed capacitive structure. This distributed capacitive structure may be formed in one example by providing a first conductive sheet 109 on a first principal surface of insulating layer 51a which is connected to one of the first or second power signals and a second conductive sheet 110 formed on a second opposite principal surface of insulating layer 51a and connected to the other one of the first and second power signals. As is further illustrated in FIGS. 12A and 12B, connection of the first conductive sheet 109 to a first power signal ball land 111 may be made through insulating substrate 51a using a conductive via 113. Second conductive sheet 110 may be directly connected to second power signal land 112.

Use of a distributed capacitive structure formed on opposite principal surfaces of the dummy substrate uppermost in a stack of semiconductor packages offer several benefits over the use of conventional intermediate substrates. First the dummy substrate, unlike the conventional intermediate substrate is positioned so as to mechanically protect the stack. Chip scale semiconductor packages are thin and somewhat fragile. In contrast, the uppermost dummy substrate can be made thicker and more rigid than the semiconductor packages. These qualities, taken together with the provision of an optional protective layer provide clear benefits.

Further, the conventional intermediate substrate must completely embed the extended leads forming the distributed capacitive structure in order to electrically isolate the structure from surrounding conductive elements. In contrast, the distributed capacitive structure suggested above may be more easily formed and patterned on the outer surfaces of the insulating substrate.

Any one of the foregoing embodiments may be capped with a protective layer 51b, as desired. The conductive sheet 90 in FIG. 9 or the conductive sheet 109 in FIG. 11 may be protected from damage by use of protective layer 51b.

Figure 13:
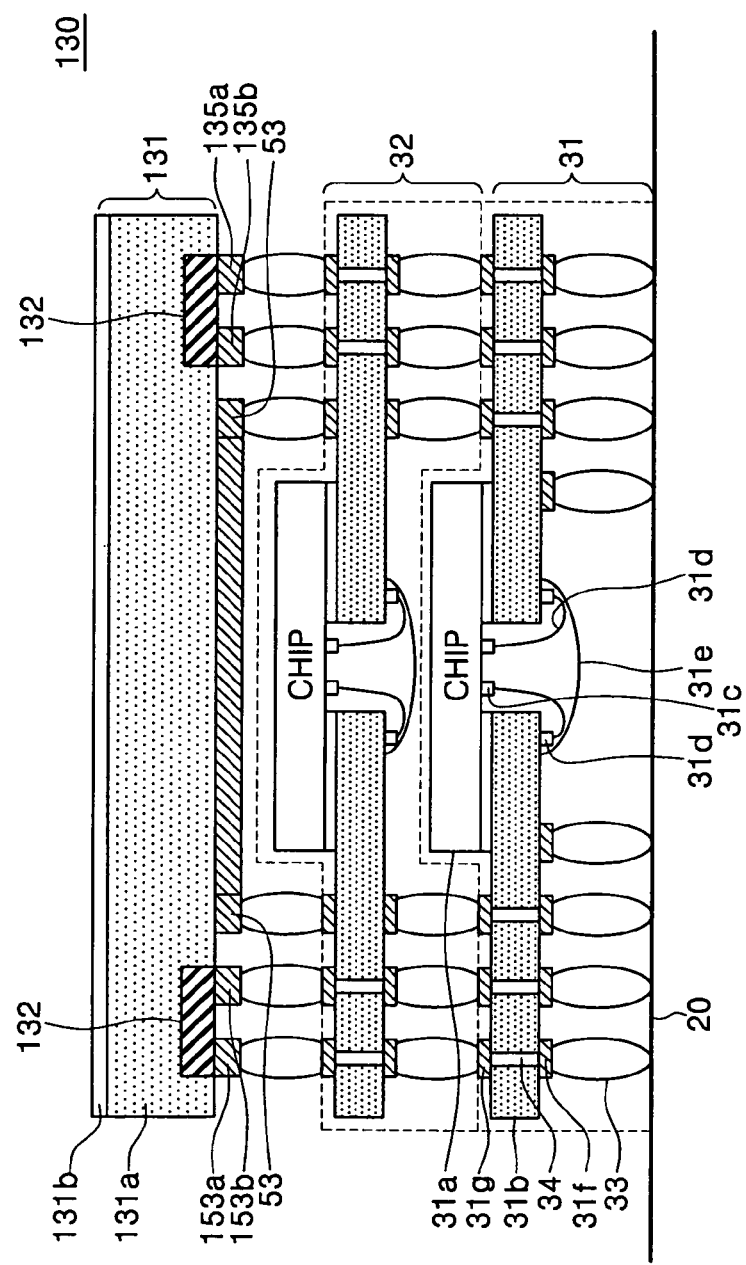

FIG. 13 illustrates a stacked semiconductor device formed in accordance with still another embodiment of the invention. However, the stacked semiconductor device shown in FIG. 13 departs from the former examples illustrating the use of an embedded discrete power capacitor or a distributed power capacitor associated with an uppermost dummy capacitor.

Instead, the exemplary stacked semiconductor device of FIG. 13 incorporates an embedded termination register 132 within a dummy substrate 131 formed from an insulating layer later 131a and an optionally formed protective layer 131b. Dummy ball land structures 53 may be used as described above.

Embedded termination register(s) 132 may be provided to condition clock signals and/or various control/address/data signals. In this regard, one or more signal bus(es) may be connected to one or more embedded termination registers 132. In the illustrated example, ball land structures 135a and 135b may be used to respectively connect a single differential clock signal to embedded termination register 132. Additionally or alternatively, a plurality of similar ball land structures may be provided to terminate any reasonable number of clock and/or control/address/data signals.

Embedded termination register(s) 132 may be formed using any one of a number of conventionally available circuits and may include various termination voltage connections. For example, embedded termination register 132(s) may be formed from discrete resistive elements or a resistive paste cream. However implemented, embedded termination register(s) 32 may be readily trimmed, as disposed on an uppermost element of the stacked semiconductor device in many embodiments, using conventional techniques.

Figure 4:
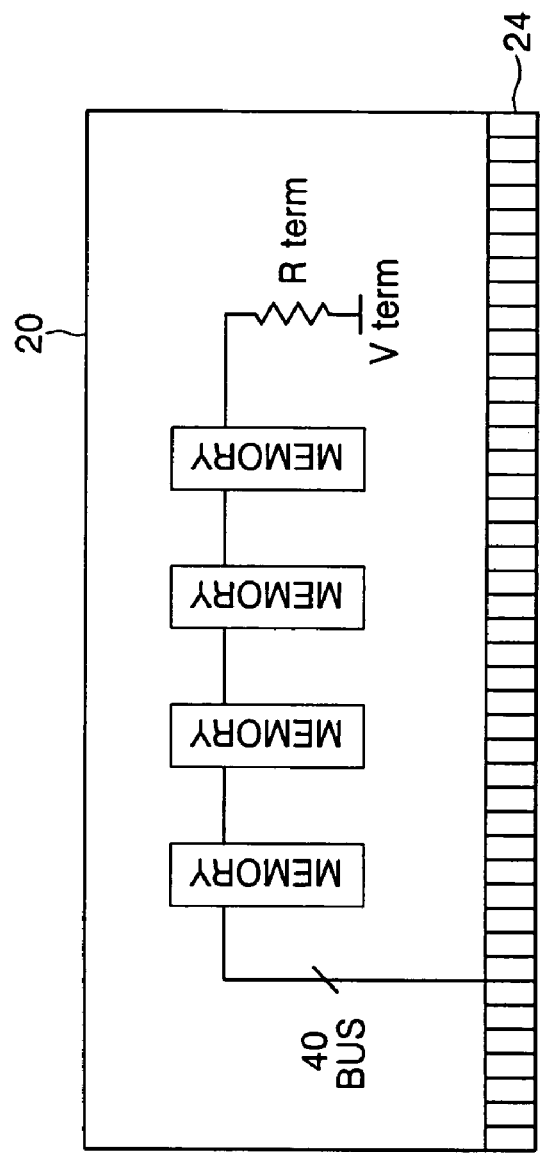
FIG. 4 is a diagram of another exemplary, conventional memory module.

Of further note, where an embedded termination register is used to terminate a clock signal (e.g., a differential clock signal) for each stacked semiconductor device on a memory module, a separate termination register may be required for each stacked semiconductor device. However, where one or more control/address/data signal(s) (see, e.g., FIG. 4) transit the memory module across multiple stacked memory devices, a single termination register may suffice to properly terminate the constituent signal(s).

Indeed, embodiments of the invention may include a dummy substrate comprising one or more embedded discrete capacitor(s) configured to condition power/clock/control/address/data signal(s), a distributed capacitor structure configured to condition one or more signal(s), and/or one or more embedded termination registers configured to condition one or more signal(s).

Further, the foregoing embodiments have suggested memory modules comprising stacked semiconductor devices mounted on but a single, principal side of the memory module PCB. Those of ordinary skill in the art will recognize, however, that the foregoing teachings may be readily applied to various memory module designs, including designs populating both principal sides of the memory module PCB.

As noted above, these and many more extrapolations, modifications and alterations to the illustrated embodiments are contemplated. The position, number and composition of the embedded discrete capacitors, distributed capacitors and termination registers will vary by design and implementing technology.

What is claimed is:

1. A semiconductor device, comprising:
a stacked arrangement of integrated circuit packages, each package comprising;
a substrate and at least one integrated circuit chip, the substrate including a first power terminal to receive a first power signal and a second power terminal to receive a second power signal and,
a dummy substrate without an integrated circuit chip formed on the stacked arrangement of integrated circuit packages and comprising a third power terminal to receive the first power signal, a fourth power terminal to the second power signal, and an embedded discrete capacitor embedded in the dummy substrate and connected between the third power terminal and the fourth power terminal.

2. The semiconductor device of claim 1, wherein each package further comprises:
a first via and a second via respectively communicating the first power signal and second power signal through the substrate,
wherein the first via and the second via are connected to the third power terminal and the fourth power terminal, respectively.

3. The semiconductor device of claim 2, wherein the first, second, third and fourth power terminals have a ball land structure.

4. The semiconductor device of claim 3, wherein an anode of the embedded discrete capacitor is formed directly on the first power terminal ball land structure and a cathode of the embedded discrete capacitor is formed directly on the second power terminal ball land structure.

5. The semiconductor device of claim 3, wherein one of an anode and a cathode of the embedded discrete capacitor are respectively connected to the first power terminal ball land structure and second power terminal ball land structure via an electrical pattern.

6. The semiconductor device of claim 3, wherein the dummy substrate further comprises an insulating layer embedding the discrete capacitor, the insulating layer comprising:
a first principal surface facing the stacked arrangement of integrated circuit packages and comprising the first power terminal ball land structure and the second power terminal ball land structure;
a second principal surface opposite the first principal surface; and,
a protective layer formed on the second principal surface.

7. The semiconductor device of claim 1, wherein the memory device package comprises one of a chip scale package (CSP), ball grid array (BGA) package, board-on-chip (BOC) package, or a through-hole stack package.

8. The semiconductor device of claim 1, wherein the first power signal is Vcc and the second power signal is Vss.

9. The semiconductor device of claim 1, wherein the dummy substrate further comprises:
an insulating layer embedding the discrete capacitor and comprising a first principal surface facing the stacked arrangement of integrated circuit packages and a second principal surface opposite the first principal surface;
a conductive electrode sheet formed on the second principal surface;
a via electrically connecting the conductive electrode sheet through the insulating layer to one of the first power terminal or the second power terminal; and,
a protective layer formed on the conductive electrode sheet.

10. The semiconductor device of claim 9, wherein the dummy substrate further comprises:
a first power terminal ball land structure formed on the first principal surface and electrically connected to an anode of the embedded discrete capacitor; and,
a second power terminal ball land structure formed on the first principal surface and electrically connected to a cathode of the embedded discrete capacitor.

11. The semiconductor device of claim 9, wherein the conductive electrode sheet comprises one or more voids adapted to thermally stabilize the conductive electrode sheet.

12. A semiconductor device, comprising:
a stacked arrangement of integrated circuit (IC) packages, each package comprising;
a substrate and at least one integrated circuit chip, the substrate receiving a first power signal and a second power signal; and,
a dummy substrate without an integrated circuit chip formed on the integrated circuit package at a top position within the stacked arrangement of IC packages and comprising:
an insulating layer comprising a first principal surface facing the integrated circuit package and a second principal surface opposite the first principal surface;
a first conductive electrode sheet formed on the first principal surface and electrically connected to a first one of the first power signal or the second power signal;
a second conductive electrode sheet formed on the second principal surface;
a via electrically connecting the second conductive electrode sheet through the insulating layer to a second one of the first power signal or the second power signal.

13. The semiconductor device of claim 12, further comprising:
a protective layer formed on at least one of the first or second conductive electrode sheets.

14. The semiconductor device of claim 12, wherein the insulating layer comprises a dielectric material.

15. A semiconductor device, comprising:
a stacked arrangement of integrated circuit packages, each package comprising;
a substrate and at least one integrated circuit chip, the substrate receiving a first power signal and a second power signal; and,
a dummy substrate without an integrated circuit chip formed on the stacked arrangement of integrated circuit packages and comprising an embedded termination register embedded in the dummy substrate and electrically connected to the at least one signal line communicating at least one signal.

16. The semiconductor device of claim 15, wherein the embedded termination register is formed from a discrete resistive element, resistive paste, or a sheet resistor.

17. The semiconductor device of claim 15, wherein the at least one signal line comprises a plurality of signal lines communicating a differential signal.

18. The semiconductor device of claim 15, wherein the at least one signal comprises a plurality of control signals, address signals, or data signals; and
wherein the at least one signal line comprises signal line bus transmitting the plurality of control signals, address signals, or data signals.

19. The semiconductor device of claim 15, further comprising:
a protective layer formed on an upper surface of the dummy substrate.

20. The semiconductor device of claim 15, wherein the dummy substrate further comprises an embedded discrete capacitor connected between the first and second power signals.

* * * * *